(12) United States Patent
Metzmacher et al.

(10) Patent No.: US 8,049,188 B2
(45) Date of Patent: Nov. 1, 2011

(54) METHOD OF CLEANING A SURFACE REGION COVERED WITH CONTAMINANT OR UNDESIRABLE MATERIAL

(75) Inventors: Christof Metzmacher, La Calamine (BE); Achim Weber, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 300 days.

(21) Appl. No.: 12/438,956

(22) PCT Filed: Aug. 27, 2007

(86) PCT No.: PCT/IB2007/053410
§ 371 (c)(1),
(2), (4) Date: Jul. 15, 2009

(87) PCT Pub. No.: WO2008/029315
PCT Pub. Date: Mar. 13, 2008

(65) Prior Publication Data
US 2009/0309045 A1 Dec. 17, 2009

(30) Foreign Application Priority Data
Sep. 4, 2006 (EP) .................................... 06120076

(51) Int. Cl.
*G03F 7/20* (2006.01)
*B08B 7/00* (2006.01)
(52) U.S. Cl. ............... 250/492.2; 250/492.1; 250/505.1; 134/1; 359/360

(58) Field of Classification Search .................. None
See application file for complete search history.

(56) References Cited

U.S. PATENT DOCUMENTS

| 6,664,554 | B2 * | 12/2003 | Klebanoff et al. ......... 250/505.1 |
| 2002/0084425 | A1 | 7/2002 | Klebanoff et al. |
| 2004/0011381 | A1 | 1/2004 | Klebanoff et al. |
| 2005/0244572 | A1 | 11/2005 | Bristol et al. |

FOREIGN PATENT DOCUMENTS

| EP | 1643310 A1 | 4/2006 |
| WO | 2004104707 A2 | 12/2004 |
| WO | 2005101122 A2 | 10/2005 |
| WO | 2006011105 A2 | 2/2006 |

* cited by examiner

Primary Examiner — Jack Berman

(57) ABSTRACT

The present invention relates to a method of cleaning a surface at least partly covered with contaminant or undesired material by applying atomic hydrogen. The invention also proposes an irradiation unit adapted to perform the cleaning method. In the present method the atomic hydrogen is generated by dissociation of molecular hydrogen directed to a surface containing catalytic material, which causes the dissociation of at least a part of the molecular hydrogen to atomic hydrogen. The surface with the catalytic material is arranged close to the surface to be cleaned and is dimensioned such that its total surface area is at least twice the surface area of the to be cleaned surface region. The method allows for the cleaning of the surface region in a constructive simple and efficient manner.

15 Claims, 2 Drawing Sheets

METHOD OF CLEANING A SURFACE REGION COVERED WITH CONTAMINANT OR UNDESIRABLE MATERIAL

FIELD OF THE INVENTION

The present invention relates to a method of cleaning a surface region at least partly covered with contaminant or undesirable material, said contaminant or undesirable material being removable or convertible by exposure with atomic hydrogen. The invention also relates to an irradiation unit, in particular for EUV-radiation and/or soft X-rays, which is adapted to apply the cleaning method to one or several optical surfaces inside said irradiation unit.

Atomic hydrogen is used in many industrial fields for the treatment of surfaces. Examples for the application of atomic hydrogen are cleaning of semiconductor structures like GaAs-structures or Si-structures by removing remainders of oxygen or carbon, low temperature cleaning, improvement of the layer quality of surface active substances during growth, chemical passivation, surface reconstruction or plasma cleaning of specimens for electron microscopy.

A further application of the treatment of surfaces is in the field of EUV-lithography, i.e. lithography with extreme ultraviolet (EUV) radiation. In EUV-lithography gracing incidence mirrors and multilayer mirrors are arranged in a vacuum chamber between the radiation source and the wafer substrate to be irradiated. For both types of mirrors an extremely high surface quality is required. Radiation sources used for EUV-lithography are gas discharge plasmas or laser plasmas. In both cases a very hot plasma is generated based on a material source, for example of Sn, Xe, Li, Sb or Te. While xenon as a noble gas is highly volatile, most of the metals are low volatile substances. These substances can move from the radiation source to the optical components and condense on the optical surfaces. Material released from the radiation source and moving in the direction of the optical components is called debris. Such optical components are for example the collector mirror and focusing mirrors as well as filters. The collector mirror, which is closest to the radiation source, can be formed of e.g. concentrically arranged ellipsoid and hyperboloid shells having a well defined distance to one and other, which is typically in the range of few centimeters or millimeters. Debris layers deposited on the optical surfaces of these optical components can reduce the quality of the optical surfaces. The same holds for secondary particles from other materials and from the vacuum which also can deposit on the optical surfaces reducing the optical quality.

Therefore, the optical surfaces of optical components of such irradiation units, in particular the optical surfaces of the collector mirror of the irradiation unit, have to be cleaned repeatedly in order to remove the contaminations deposited on these optical surfaces.

BACKGROUND OF THE INVENTION

Conventionally, atomic hydrogen is produced via dissociation of molecular hydrogen by means of plasma discharge, microwave discharge, dielectric inhibited discharge or by thermal activation using a hot tungsten wire. The generation of atomic hydrogen, however, must be performed in close proximity to the optical surface to be cleaned, since atomic hydrogen recombines and reacts with other substances with high probability and therefore cannot be transported over larger distances without significant loss. This often means that the above mentioned discharge or thermal activation techniques require the corresponding devices to be arranged close to the optical surfaces to be cleaned. In particular in EUV irradiation units the appropriate arrangement of a radiation or plasma source or of hot filaments for generation of atomic hydrogen leads to additional complexity of construction. Furthermore, the impact of a localized plasma can cause an accelerated chemical and/or physical degradation of the optical components, for example of the mechanical stability of the optical components.

EP 1 643 310 A1 describes a method for removal of deposited material on an optical element by exposing the optical element to atomic hydrogen. For the generation of the atomic hydrogen by dissociation of molecular hydrogen several measures are proposed, including the use of a hot filament, the use of plasma radiation or the use of a catalyst configured to convert molecular hydrogen into atomic hydrogen. As an example, a Ru protection layer on the surface of a gracing incidence mirror or of a multilayer mirror, wherein Ru is included in a top layer, is proposed as the catalyst to dissociate molecular hydrogen into atomic hydrogen. The document, however, is silent and does not include any information about the parameters and efficiency of dissociation and cleaning when using such a catalyst.

SUMMARY OF THE INVENTION

It is an object of the present invention to provide a method of cleaning a first surface region at least partly covered with contaminant or undesirable material using atomic hydrogen, the method allowing an effective cleaning of the first surface region without the need of a complex construction. It is a further object of the present invention, to provide an irradiation unit, in particular for EUV radiation and/or soft X-rays, which is adapted to perform the cleaning method.

The object is achieved with the method and irradiation unit of present claims 1 and 13. Advantageous embodiments of the method and or the irradiation unit are subject of the sub claims and are furthermore disclosed in the following description and examples for carrying out the invention.

In the proposed method of cleaning a first surface region at least partly covered with contaminant or undesirable material, said contaminant or undesirable material being removable or convertible by exposure with atomic hydrogen, one or several second surface regions with catalytic material are provided in proximity to the first surface region. The catalytic material is selected to cause dissociation of molecular hydrogen when coming in contact with the second surface region(s). The one or several second surface regions are provided with a total surface area (i.e. the sum of the total surface areas of the single surface regions in case of several surface regions) which is at least twice the total surface area of the first surface region to be cleaned. A gas flow of a molecular hydrogen containing gas or gas mixture is directed to or along said one or several second surface regions in such a manner that said molecular hydrogen containing gas or gas mixture gets in contact with said one or several second surface regions before passing said first surface region. Due to this contact with the second surface regions part of the molecular hydrogen of the gas flow dissociates without influence or necessity of additional radiation or additional thermal activation to atomic hydrogen which is transported with said gas flow to the first surface region removing or converting said contaminant or undesirable material.

Preferably, the molecular hydrogen containing gas or gas mixture contains additional cleaning gases. Such cleaning gases as for example halogen containing gases support the removal of contaminant or undesirable material.

The proposed method is based on the use of particularly prepared surface regions, which are able to dissociate molecular hydrogen when coming in contact with the surface regions. A main aspect of this method is that these second surface regions have to be provided with at least the double surface area compared to the surface area of the first surface region to be cleaned in order to achieve an effective cleaning of this first surface region. Preferably the total surface area of the second surface region(s) is at least twice the surface area of the surface which includes the first surface region to be cleaned, i.e. in case of a mirror the whole surface of the reflecting side of the mirror. Since the second surface regions can be provided on surfaces of already existent components or walls in the proximity of the first surface region to be cleaned, the method does not cause additional complexity of the construction of the device containing the first surface region. In particular, the need of a physical sputter component, for example of local plasma, is completely avoided. This also means that any degradation of components, for example of the mechanical stability of optical components to be cleaned, can be excluded. Furthermore, the second surface regions can be included without disturbing the operation of the device containing the surface region to be cleaned, for example a EUV irradiation unit.

As already indicated, the second surface regions can be provided on one or several already existing components of a device, in which the component with the first surface region is arranged. This means that such components, which already fulfill other functions required for operation of said device, can be adapted to also provide the second surface regions with the catalytic material, for example by depositing a layer of the catalytic material to one or several surface regions of these components or by fabricating the components completely of the catalytic material.

Possible application fields of the present method are the cleaning of semiconductor surfaces like GaAs-structures or Si-structures by removing remainders of oxygen or carbon from the surfaces, low temperature cleaning, improvement of layer quality of surface active substances during growth, chemical passivation, surface reconstruction or plasma cleaning of electron microscopic specimens. The term cleaning in the present application means any surface treatment in which contaminant or undesirable material on the surface is removed or converted to another (desired) material. The method is applicable in all fields in which undesired materials on surfaces, which are removable or convertible by exposure with atomic hydrogen, should be removed or converted. In most cases, the surfaces to be cleaned are arranged in a vacuum chamber. This is also the case in a preferred application, namely the cleaning of optical surfaces in EUV irradiation units. The contaminating material deposited on the optical surfaces is mainly debris material in that case. With the proposed method it is possible to maintain the high optical quality of optical surfaces in such an EUV irradiation unit, in particular for maintaining a high optical reflectivity, and at the same time to remove undesired foreign materials without affecting the physical properties of the optical components, for example their mechanical stability.

Preferred catalytic materials for use with the second surface regions are noble metals like for example Pd, Pt, Ru, Rh or metals with free electrons like Al or Be. Furthermore also semimetals like graphite and semiconductors can be used as long as these materials cause dissociation of molecular hydrogen when coming into contact with them at temperatures between 0° C. and 300° C.

The second surfaces with said catalytic material are arranged in proximity to the first surface region to be cleaned. This means that these surfaces must be close enough to the first surface region to avoid a significant reduction of the atomic hydrogen content of the gas flow until the first surface region is reached. Preferably the distance between the second surface region and the first surface region is not more than 10 cm (at the closest distance between the surface regions), if both regions are one after the other in the direction of the flow and separated only by a material with a low sticking coefficient with respect to atomic hydrogen. A low sticking coefficient, e.g. of quartz, refers to a small re-consumption probability of atomic hydrogen. All non-catalytic materials such as stainless steel have a higher sticking coefficient and thus, the distance between the second surface region and the first surface region should be significantly smaller than 10 cm in these cases. Furthermore, the gas is preferably supplied under vacuum conditions to the first surface region in order to reduce the reaction probability of atomic hydrogen with other gas molecules on the way between the second surface regions and the first surface region.

The catalytic materials may be provided as surface layers on components of the device, in which the surface to be cleaned is arranged. For example, in case of a EUV irradiation unit, the catalytic materials can be provided on the inner walls of the gas supply tubes and/or on the inner walls of the vacuum chamber. Furthermore, the catalytic materials can also be provided at surfaces of components within the vacuum chamber, in particular at front and/or back surfaces of optical components. This allows the dissociation of the molecular hydrogen directly inside the gas supply and/or in the vacuum chamber and/or directly at the optical component to be cleaned. Any further activation source, for example a radiation source or a thermal source, is avoided. Instead of providing a layer of the catalytic material on the component it is also possible to manufacture the corresponding component as a whole from the catalytic material. The second surfaces can also be provided by instream positioned dedicated devices, for example by a lattice or mesh structure through which the gas flow is directed.

In a preferred embodiment, in which the collector mirror of a EUV irradiation unit is to be cleaned, the backsides of the different mirror shells of this collector mirror are provided with a layer of the catalytic material. In addition or as an alternative embodiment the mirrors have a Ru top layer so that a part of the mirror surface (not covered with debris) may serve as a second surface region for dissociation. This is possible since the debris mainly deposits on the part of the collector mirror which is close to the radiation source, so that the remaining parts of the collector mirror which are more distant to the radiation source are not or only partly or less covered with debris and still provide sufficient free material for the dissociation of molecular hydrogen. In this case the gas flow of the molecular hydrogen containing gas is directed from the side opposing the radiation source in direction to the radiation source.

The proposed method can also be applied during the operation of the EUV irradiation unit. Preferably the cleaning step of the present method is performed in breaks of operation of the EUV irradiation unit. During the cleaning step, also inert transport gases like argon, helium, xenon or neon and mixtures of such gases can be supplied. The same applies for additional cleaning gases as already known in the art. The preferable gas pressure of the molecular hydrogen containing gas or gas mixture is in the range of 200-1000 hPa (mbar) and the preferable flow velocity is in the range of 10-50 mm/s. The temperature at the cleaning site is preferable between 30° C. and 250° C.

The proposed irradiation unit, in particular for EUV radiation and/or soft X-rays, comprises at least a radiation source and one or several optical components in a vacuum chamber having one or several inlet and outlet passages for gas delivery. The irradiation unit comprises one or several surface regions with catalytic material which are arranged in proximity to at least one optical surface region of at least one of the optical components. The catalytic material is selected to cause dissociation of molecular hydrogen. The one or several surface regions with catalytic material are dimensioned to have a total surface area which is at least twice the surface area of the optical surface region to be cleaned. At least one of said one or several inlet passages for gas delivery is formed to direct a gas flow against or along said one or several surface regions with catalytic material in such a manner that said gas gets in contact with said one or several surface regions with catalytic material before passing said optical surface region to be cleaned. The irradiation unit is designed to be able to perform the cleaning method of the present invention.

These and other aspects of the invention will be apparent from and elucidated with reference to the embodiments described herein after.

BRIEF DESCRIPTION OF THE DRAWINGS

The proposed method and irradiation unit are described in the following by way of examples in connection with the accompanying figures without limiting the scope of protection as defined by the claims. The figures show:

DETAILED DESCRIPTION OF EMBODIMENTS

Figure 1:
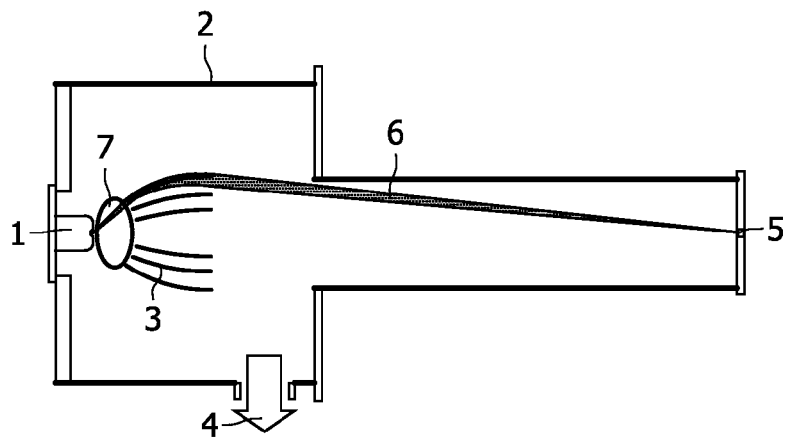
FIG. 1 an example of a EUV irradiation unit.

FIG. 1 schematically shows a typical layout of at least a part of a EUV irradiation unit for EUV lithography. The EUV irradiation unit basically consists of the radiation source 1 and a collector mirror 3 in a vacuum vessel 2. The vacuum vessel 2 is connected to a vacuum pump (not shown) through gas outlet 4. The radiation emitted from the radiation source 1 and indicated by one exemplary radiation beam 6 is collected by reflective collector mirror 3 and focused on an intermediate focus 5. At the position of this intermediate focus 5 an aperture may connect this part of the EUV irradiation unit with a second part. In this second part, not shown in FIG. 1, further optical components may be arranged to guide the radiation from the intermediate focus 5 to a mask and a wafer substrate in the case of EUV lithography and/or to achieve a desired beam shaping. In most EUV irradiation units means for debris mitigation 7 are arranged between the radiation source 1 and the collector mirror 3. In order to achieve economical operation of the irradiation unit the debris should be reduced by at least seven orders of magnitude. Such a high mitigation is very difficult on the short distance between the radiation source 1 and the collector mirror 3 and up to now could not be experimentally demonstrated. Therefore, there is a high need for suitable cleaning methods in order to extend the lifetime of the collector mirror 3.

Figure 2:
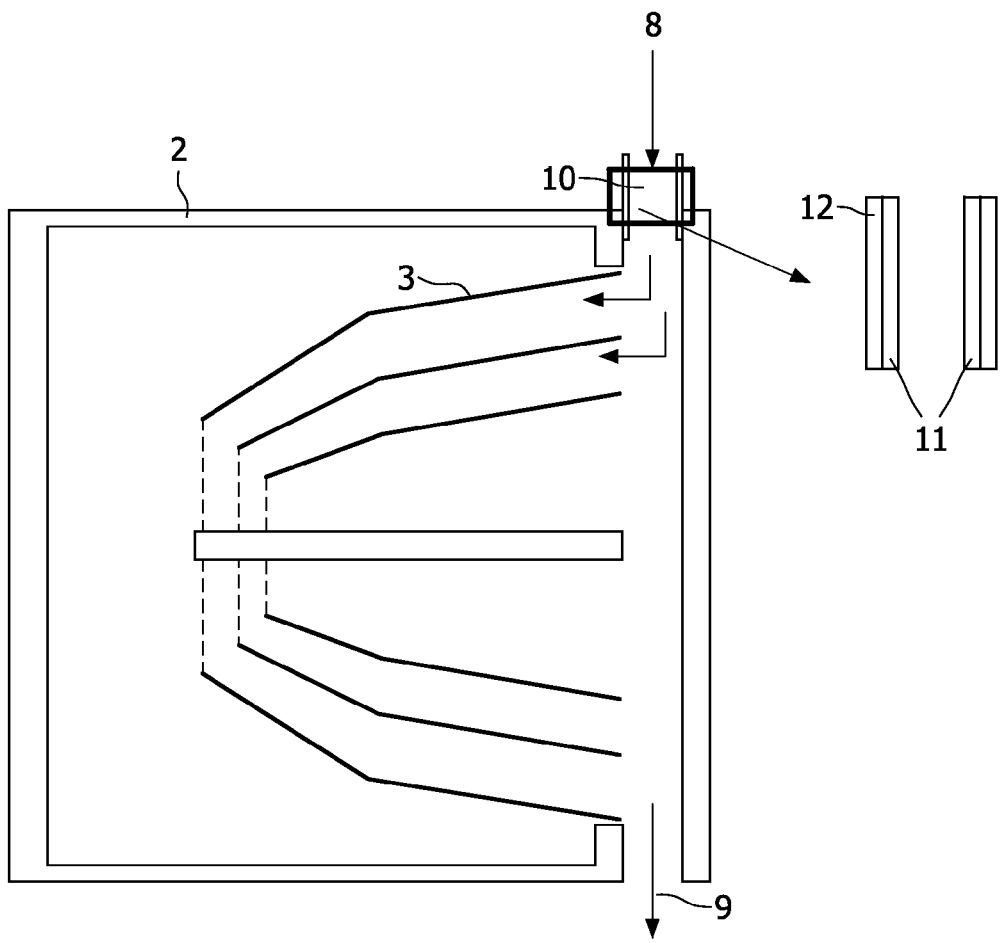
FIG. 2 a schematic view of an exemplary arrangement for the cleaning of a collector mirror.
Figure 3:
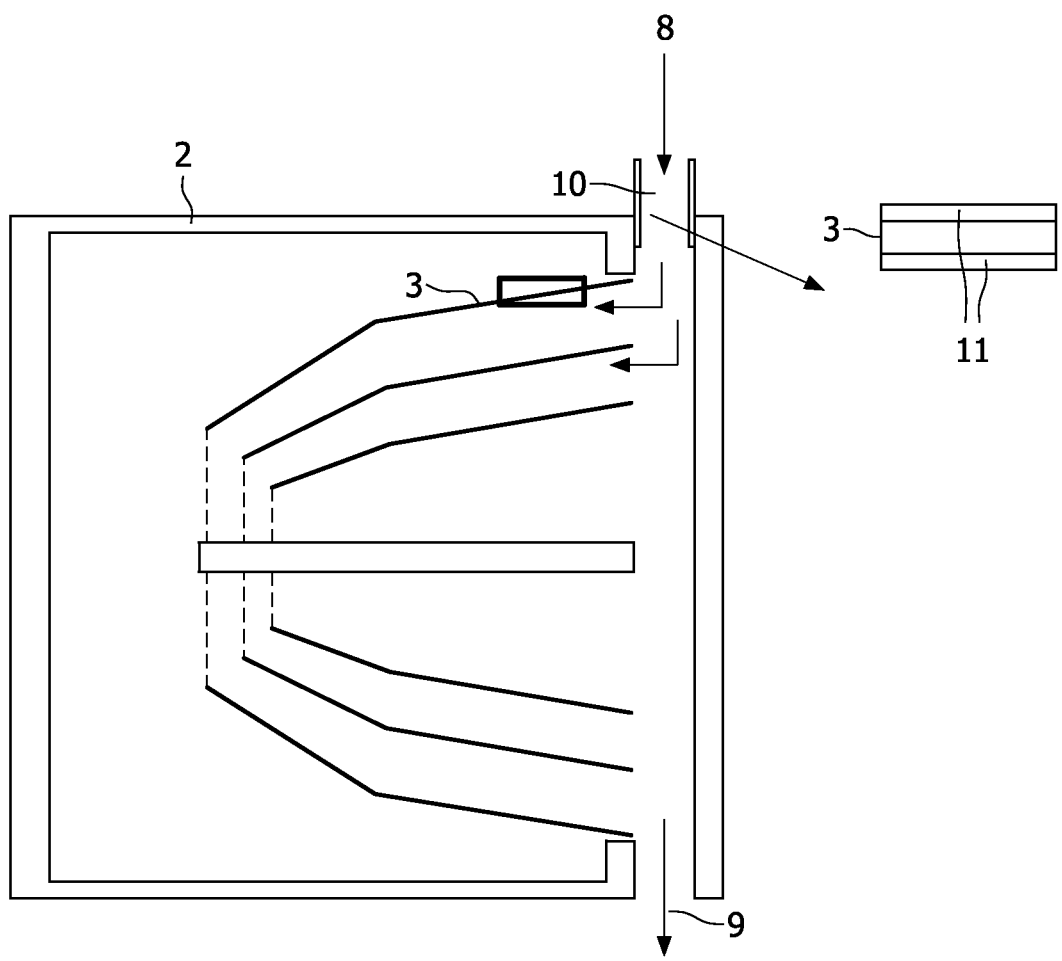
FIG. 3 a schematic view of a further exemplary arrangement for the cleaning of a collector mirror.

Such a EUV irradiation unit as shown in FIG. 1 can be adapted to enable the performance of the proposed cleaning method. FIGS. 2 and 3 show examples for such a modification in which only the collector mirror 3 and the vacuum vessel 2 are schematically shown. In these examples the vacuum vessel 2 is closed on both sides of the collector mirror 3, which can be achieved with appropriate closing elements between the collector mirror 3 and the radiation source 1 and between the collector mirror 3 and the remaining volume of the vacuum vessel. Nevertheless, it is also possible to perform the proposed method without such closing elements, for example during operation of the EUV irradiation unit. Furthermore, the present method can also be applied ex-situ in a separate cleaning device.

FIG. 2 shows an example of a part of a EUV irradiation unit which is adapted according to the present invention. In this example a gas inlet 10 is arranged close to the collector mirror 3 at the side of the collector mirror 3 opposing the radiation source. The vacuum vessel is connected to a vacuum pump (not shown) through gas outlet 9. With this arrangement a gas flow of a molecular hydrogen containing gas 8 is directed from this opposing side in the direction of the radiation source through the shells of collector mirror 3 as indicated by the arrows. The inner walls 12 of the gas inlet 10, which may be formed as a gas tube, are covered with the catalytic material 11 as can be seen in the enlarged portion of FIG. 2. In the same manner, also the inner walls of vacuum vessel 2 in this region can be covered with such catalytic material. As the catalytic material preferable one or several of the following materials are selected: Pd, Pt, Ru, Rh. Gas inlet 10 may also be formed totally from the catalytic material. The total area of the surface with catalytic material is selected such that this area exceeds the area of the optical surface to be cleaned at least by the factor 2. This ensures that a sufficiently high amount of atomic hydrogen is generated at the gas inlet 10 to reach the surface to be cleaned of the collector mirror 3 with a sufficiently high concentration for efficient cleaning of this surface.

In a further exemplary embodiment the front and backsides of the different shells of the collector mirror 3 are covered with an appropriate catalytic material 11 as shown in the enlarged portion of FIG. 3. The front side, i.e. the reflecting surface, of the shells of collector mirror 3 is covered with a Ru layer which has a high reflection coefficient for the EUV radiation. The backside of the shells is covered with Rh, which is also a catalytic material for the dissociation of molecular hydrogen. The molecular hydrogen containing gas 8 is supplied from the side opposing the radiation source to the collector mirror 3 to flow in the counter direction of the optical radiation path. Due to this counter flow the reflecting Ru surface of the collector mirror 3 in this opposing part also causes dissociation of the molecular hydrogen, since this portion is not or is only partly covered with debris of the radiation source. This debris mainly covers the portion closer to the radiation source. Therefore, the mirror surface itself in this upstream portion is used, preferably together with the back side surfaces of the mirror shells, to generate a sufficient amount of atomic hydrogen for effective cleaning of the surface regions lying downstream.

While the invention has been illustrated and described in detail in the drawings and foregoing description, such illustration and description are to be considered illustrative or exemplary and not restrictive; the invention is not limited to the disclosed embodiments. For example, it is also possible to provide additional gas supplies for supply of molecular hydrogen containing gas or to manufacture components of the irradiation unit like the vacuum vessel or the gas inlets or gas supplies completely of the catalytic material. Furthermore, the different embodiments described above can also be combined.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope of these claims.

LIST OF REFERENCE SIGNS 1 radiation source
2 vacuum vessel
3 collector mirror
4 gas outlet
5 intermediate focus
6 radiation beam
7 means for debris mitigation
8 molecular hydrogen containing gas
9 gas outlet
10 gas inlet
11 catalytic material
12 inner walls

The invention claimed is:

1. A method of cleaning a first surface region at least partly covered with contaminant or undesirable material, said contaminant or undesirable material being removable or convertible by exposure to atomic hydrogen, wherein the method includes:
   providing one or several second surface regions with catalytic material (11) in proximity to the first surface region,
      said catalytic material (11) being selected to cause dissociation of molecular hydrogen and
      said one or several second surface regions having a total surface area which is at least twice a surface area of said first surface region,
   directing a gas flow of a molecular hydrogen containing gas (8) or gas mixture to or along said one or several second surface regions in such a manner that
      said molecular hydrogen containing gas (8) or gas mixture gets in contact with said one or several second surface regions before passing said first surface region, wherein part of the molecular hydrogen dissociates to atomic hydrogen which is transported with said gas flow to the first surface region removing or converting said contaminant or undesirable material.

2. The method according to claim 1,
wherein said one or several second surface regions with catalytic material (11) are provided on one or several components (2, 3, 10) of a device, in which said first surface region is arranged, said components (2, 3, 10) apart from comprising the second surface regions also fulfilling other functions required for operation of said device.

3. The method according to claim 1,
wherein said first surface region is at least part of an optical surface of an optical component (3) in an irradiation unit for EUV-radiation and/or soft X-rays and said contaminant material is debris material deposited on said optical surface.

4. The method according to claim 3,
wherein said one or several second surface regions are surface regions of components (2, 3, 10) and/or of an inner wall of a vacuum vessel (2) of said irradiation unit and/or of instream positioned dedicated devices.

5. The method according to claim 3,
wherein said one or several second surface regions are surface regions of the optical surface and/or surface regions of backsides of optical components (3) of said irradiation unit.

6. The method according to claim 3,
wherein said optical component is a collector mirror (3) and at least a part of said one or several second surface regions is provided on front and/or backsides of shells of said collector mirror (3).

7. The method according to claim 6,
wherein said gas flow of a molecular hydrogen containing gas (8) or gas mixture is directed to the collector mirror (3) from a side opposite to a radiation source (1) of the irradiation unit towards the radiation source (1).

8. The method according to claim 4,
wherein said one or several second surface regions are provided inside one or several gas supplies (10) for supplying the molecular hydrogen containing gas (8) or gas mixture to the optical surface.

9. The method according to claim 1,
wherein said catalytic material (11) is selected from the materials Pd, Pt, Ru and Rh.

10. Irradiation unit, in particular for EUV-radiation and/or soft X-rays, comprising at least a radiation source (1) and one or several optical components (3) in a vacuum vessel (2) having one or several gas inlet (10) and gas outlet passages (9), wherein
   one or several surface regions with catalytic material (11) are arranged in proximity to at least one optical surface region of at least one of the optical components (3),
      said catalytic material (11) being selected to cause dissociation of molecular hydrogen and
      said one or several surface regions with catalytic material (11) having a total surface area which is at least twice a surface area of said optical surface region, and
   at least one of said one or several gas inlet passages (10) is formed to direct a gas flow along said one or several surface regions with catalytic material (11) in such a manner that said gas gets in contact with said one or several surface regions with catalytic material (11) before passing said optical surface region.

11. Irradiation unit according to claim 10,
wherein said one or several surface regions with catalytic material (11) are inner surface regions of the one or several inlet passages (10) and/or of an inner wall of the vacuum vessel (2) and/or of instream positioned dedicated devices.

12. Irradiation unit according to claim 10,
wherein said one or several surface regions with catalytic material (11) are surface regions of optical surfaces and/or of backsides of said one or several optical components (3).

13. Irradiation unit according to claim 10,
wherein one of said optical components is a collector mirror (3) and at least a part of said one or several second surface regions is provided on front and/or backsides of shells of said collector mirror (3).

14. Irradiation unit according to claim 13,
wherein said at least one of said one or several gas inlet passages (10) is arranged to direct the gas flow to the collector mirror (3) from a side opposite to the radiation source (1) towards the radiation source (1).

15. Irradiation unit according to claim 10,
wherein said catalytic material (11) is selected from the materials Pd, Pt, Ru and Rh.

* * * * *